United States Patent [19]

Nonaka

[11] Patent Number: 5,391,897
[45] Date of Patent: Feb. 21, 1995

[54] STATUS INDUCTION SEMICONDUCTOR DEVICE

[75] Inventor: Kenichi Nonaka, Saitama, Japan

[73] Assignee: Honda Giken Kogyo Kabushiki Kaisha, Tokyo, Japan

[21] Appl. No.: 122,103

[22] Filed: Sep. 15, 1993

[30] Foreign Application Priority Data

Sep. 16, 1992 [JP] Japan .................. 4-272306

[51] Int. Cl.⁶ .............................................. H01L 29/80
[52] U.S. Cl. ...................................... 257/136; 257/192; 257/196; 257/197; 257/498
[58] Field of Search ................ 257/136, 192, 196, 197, 257/498

[56] References Cited

U.S. PATENT DOCUMENTS

| | | |
|---|---|---|
| 4,484,207 | 11/1984 | Nishizawa et al. |
| 4,608,582 | 8/1986 | Nichizawa |
| 4,738,935 | 4/1988 | Shimbo et al. ........... 257/498 |

FOREIGN PATENT DOCUMENTS 59-79574  5/1984  Japan .................. 257/498

OTHER PUBLICATIONS

High Frequency Characteristics of GaAs Vertical JFET Devices Operated in the Bipolar Mode (G. Schweeger) Jan., 1992.

*Primary Examiner*—Edward Wojciechowicz
*Attorney, Agent, or Firm*—Lyon & Lyon

[57] ABSTRACT

A static induction semiconductor device has a low-resistance drain region, a high-resistance layer disposed on the drain region, a low-resistance source region spaced from the high-resistance layer, a low-resistance gate region disposed in the high-resistance layer, and a hetero layer disposed in an interface between the high-resistance layer and the source region and an interface between the gate region and a surface protective layer on the gate and source regions. The hetero layer, which may be made of AlGaAs, has a band gap larger than a semiconductor crystal such as GaAs of the drain, source, and gate regions. The static induction semiconductor device has a low resistance turned on and can operate in a bipolar mode.

12 Claims, 4 Drawing Sheets

STATUS INDUCTION SEMICONDUCTOR DEVICE

BACKGROUND OF THE INVENTION

1. Field of the Invention

The present invention relates to a static induction semiconductor device for use as a high-power switching device capable of handling high electric power.

2. Description of the Prior Art

Static induction transistors (SIT), invented by Professor Nishizawa of Tohoku University, Japan, in 1960, have been finding a wide range of applications through many research and development efforts, which have resulted in various excellent static induction semiconductor devices for use as highly efficient high-power devices, image sensors, and high-speed ICs.

One typical static induction transistor is shown in FIG. 6 of the accompanying drawings. As shown in FIG. 6, the conventional static induction transistor includes a low-resistance layer 601 of n-type silicon crystal and a high-resistance layer 602 of n-type silicon crystal which are successively deposited on a drain electrode 612. The conventional static inductor transistor also includes a spaced low-resistance layer 603 of n-type semiconductor crystal which is deposited on the high-resistance layer 602. The low-resistance layer 603 serves as a source region, and the low-resistance layer 601 as a drain region. A p-type gate region 604, which is of a resistance layer 602, is disposed in the high-resistance layer 602 around the source region 603. Protective layers 610 are deposited on the surfaces of the gate region 604 and the source region 603. Source and gate electrodes 611, 613 are disposed in contact with the source and gate regions 603, 604, respectively.

In operation, a current flowing between the source and drain regions 603, 601 is controlled when the condition of a depletion layer in the high-resistance layer 602 is varied by a gate bias applied through the gate electrode 613.

While various high-performance static induction semiconductor devices of silicon crystal have been developed, few research attempts have been made with respect to static induction semiconductor devices made of gallium arsenide (GaAs). In particular, almost no research reports are known with respect to high-power switching devices made of GaAs in the form of static induction semiconductor devices.

To realize high-power switching devices made of GaAs as static induction semiconductor devices, it is necessary to reduce their resistance when they are turned on. To meet such a requirement, they have to operate in a bipolar mode to keep the gate forward-biased. However, it is difficult to operate a GaAs high-power switching device, such as a static induction semiconductor device, in a bipolar mode if it has the conventional structure of a silicon switching device.

SUMMARY OF THE INVENTION

It is therefore an object of the present invention to provide a static induction semiconductor device of GaAs which is capable of operating in a bipolar mode.

According to the present invention, there is provided a static induction semiconductor device comprising a first low-resistance layer of a first semiconductor crystal having a first conductivity type, the first low-resistance layer serving as a drain region, a high-resistance layer of the first semiconductor crystal having the first conductivity type, the high-resistance layer being disposed on the first low-resistance layer, a second low-resistance layer of the first semiconductor crystal having the first conductivity type, the second low-resistance layer being spaced from the high-resistance layer, the second low-resistance layer serving as a source region, a third low-resistance layer of the first semiconductor crystal having a second conductivity type, the third low-resistance layer being disposed in the high-resistance layer in surrounding relationship to the source region and serving as a gate region, a protective layer disposed on a surface of the gate region and a surface of the source region, and a hetero layer of a second semiconductor crystal having the first conductivity type, the hetero layer being disposed in an interface between the high-resistance layer and the source region and an interface between the gate region and the protective layer, the hetero layer having a band gap larger than the first semiconductor crystal.

The first semiconductor crystal may be GaAs and the second semiconductor crystal may be AlGaAs.

The static induction semiconductor device may further comprise a channel doped layer of the second conductivity type disposed in an interface between the high-resistance layer and the hetero layer, and a high-resistance layer of the first conductivity type disposed in an interface between the channel doped layer and the hetero layer.

The hetero layer may be thicker immediately beneath the source region and thinner immediately beneath the protective layer.

The above and further objects, details and advantages of the present invention will become apparent from the following detailed description of preferred embodiments thereof, when read in conjunction with the accompanying drawings.

DETAILED DESCRIPTION OF THE PREFERRED EMBODIMENTS

Figure 1:
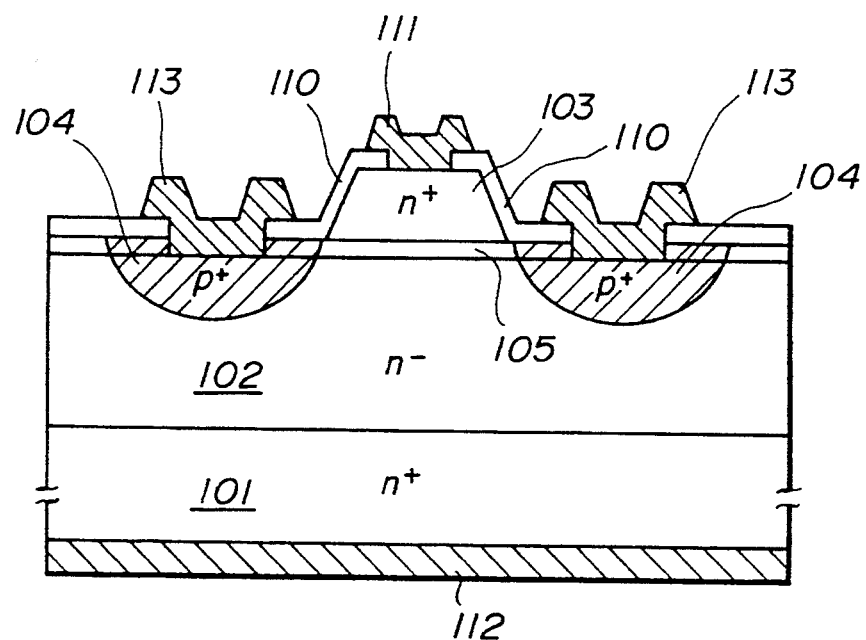
FIG. 1 is a fragmentary cross-sectional view of a static induction semiconductor device comprising GaAs, according to an embodiment of the present invention.

Like or corresponding parts are denoted by like or corresponding reference numerals throughout views.

As shown in FIG. 1, a static induction semiconductor device comprising GaAs, according to an embodiment of the present invention, includes a drain region 101 comprising an n-type low-resistance layer of GaAs, and an n-type high-resistance layer 102 of GaAs deposited on the drain region 101. The static induction semiconductor device of GaAs also includes a source region 103 comprising an n-type low-resistance layer of GaAs, the gate regions 104 being disposed in the high-resistance layer 102. A low-resistance hetero layer 105 of n-type AlGaAs is positioned at the boundary between the high-resistance layer 102 and the source region 103 and also at the boundary between the high-resistance layer 102 and a surface protective layer 110 which extends over the source region 103, the gate region 104, and the hetero layer 105. Source, drain, and gate electrodes 111, 112, 113 are disposed in contact with the source, drain, and gate regions 103, 101, 104, respectively.

The n-type low-resistance layer of GaAs of the drain region 101 is doped with a dosage of $10^{18}$ cm$^{-3}$ and has a thickness of about 350 $\mu$m. The high-resistance layer 102 on the drain region 101 is doped with a dosage of $10^{14}$ cm$^{-3}$ and has a thickness of about 35 $\mu$m. The hetero layer 105, which is made of Al$_x$Ga$_{x-1}$As, deposited on the high-resistance layer 102 is doped with a dosage of $5 \times 10^{17}$ cm$^{-3}$ and has a thickness of about 800 Å. The hetero layer 105 is of a graded structure such that the composition ratio x of Al thereof is about 0.3 throughout the thickness of 200 Å in its central region, and progressively increases from 0 to about 0.3 throughout the thickness of 300 Å in opposite regions on both sides of the central region.

The n-type low-resistance layer of GaAs of the source region 103 deposited on the hetero layer 105 is doped with a dosage of $10^{18}$ cm$^{-3}$ and has a thickness of about 2000 Å. The p-type low-resistance layer of the gate region 104, which is disposed in surrounding relationship to the source region 103, is formed by diffusing a p-type impurity at a dosage of $10^{18}$ cm$^{-3}$ into the n-type high-resistance layer 102 and the hetero layer 105. The surface protective layer 110, which may be made of SiO$_2$, is deposited on the surfaces of the source region 103 and the gate region 104. The surface protective layer 110 has contact windows through which the source and gate electrodes 11, 113 are held in contact with the source and gate regions 103, 104, respectively. The drain electrode 112 is disposed on the entire lower surface of the drain region 101.

The static induction semiconductor device shown in FIG. 1 operates as follows: Electrons, which are a majority carrier, are injected from the source region 103 through the hetero layer 105 having a large band gap, which is larger than GaAs, into the high-resistance layer 102, and travel through the high-resistance layer 102 in a direction toward the drain region 101. When the electrons reach the drain region 101, they generate a drain current in a direction opposite to the direction in which they travel through the high-resistance layer 102. At the same time that the electrons are injected, holes, which are a minority carrier, are injected from the gate region 104 into the high-resistance layer 102. The holes injected into the high-resistance layer 102 tend to flow into the source region 103. However, the holes remain in the high-resistance layer 102 because they are blocked by a potential barrier formed by the hetero layer 105 that exists between the high-resistance layer 102 and the source region 103 into the high-resistance layer 102 is accelerated to neutralize the positive charges in the high-resistance layer 102.

Some of the holes in the gate region 104 are trapped by a surface level that is developed in the interface between the gate region 104 and the surface protective layer 110, and recombine with electrons injected from the source region 103 through the surface level, lowering the injection efficiency of the electrons. However, the reduction in the injection efficiency of the electrons is small because the density of a surface level developed in the interface between the hetero layer 105 with its large band gap and the surface protective layer 110 is lower than that in the interface between the GaAs layer and the surface protective layer 110, and hence the number of electrons and holes that recombine is small.

Figure 2:
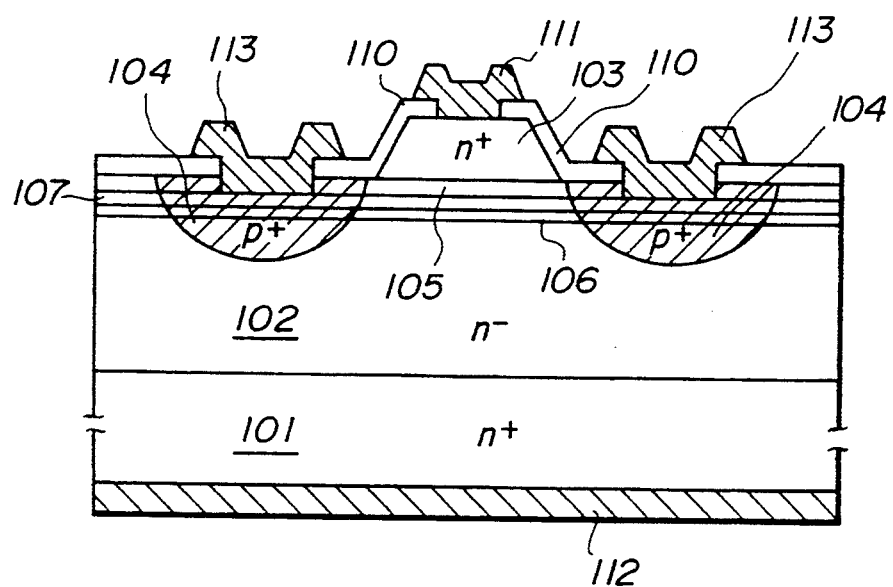
FIG. 2 is a fragmentary cross-sectional view of a static induction semiconductor device comprising GaAs, according to still another embodiment of the present invention.

FIG. 2 shows a static induction semiconductor device comprising GaAs, according to another embodiment of the present invention.

The static induction semiconductor device shown in FIG. 2 differs from the static induction semiconductor device shown in FIG. 1 in that a p-type channel doped layer 106 is disposed between the n-type high-resistance layer and the hetero layer 105 with an n-type high-resistance layer 107 interposed between the p-type channel doped layer 106 and the hetero layer 105. The p-type channel doped layer 106 serves to increase the dielectric strength of the device. The n-type high-resistance layer 107 is interposed between the p-type channel doped layer 106 and the hetero layer 105 in order to prevent the entire hetero layer 105 from being depleted and hence the injection efficiency from being lowered. Preferably, the p-type channel doped layer 106 may be doped with a dosage of $10^{16}$ cm$^{-3}$ and have a thickness of about 2000 Å, and the high-resistance layer 107 may be doped with a dosage of $10^{15}$ cm$^{-3}$ and have a thickness of about 0.2 $\mu$m.

Figure 3:
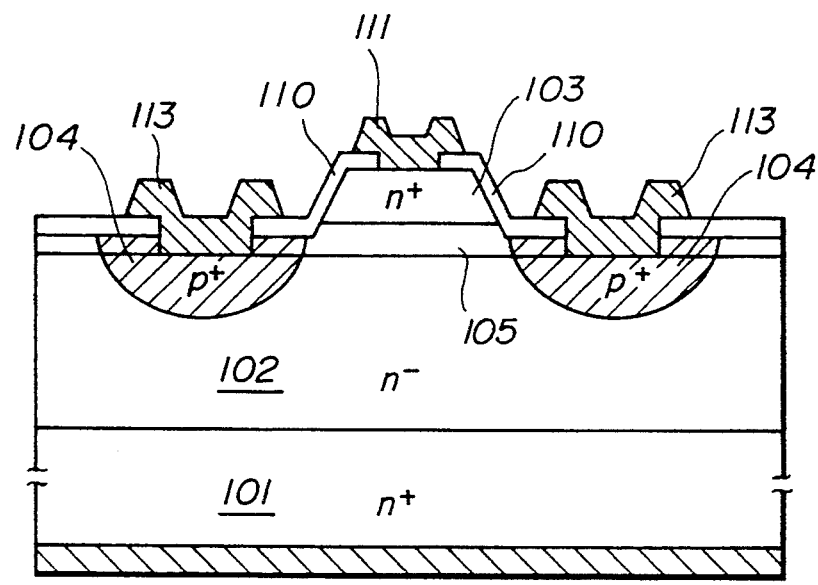
FIG. 3 is a fragmentary cross-sectional view of a static induction semiconductor device comprising GaAs, according to still another embodiment of the present invention.

FIG. 3 shows a static induction semiconductor device comprising GaAs, according to still another embodiment of the present invention.

The static induction semiconductor device shown in FIG. 3 is substantially similar to the static induction semiconductor device shown in FIG. 1 except that the n-type hetero layer 105 is thicker immediately beneath the source region 103 and thinner immediately beneath the surface protective layer 110. Since the n-type hetero layer 105 is thicker immediately beneath the source region 103, a nondepletion region is developed in the interface with the source region 103, thus increasing the injection efficiency. Immediately beneath the surface protective layer 110, however, a depletion region is developed up to the interface with the surface protective layer 110 as the hetero layer 15 is thinner. Therefore, the number of pairs of holes and electrons that are recombined through the surface level is reduced, thus increasing the injection efficiency.

Figure 4:
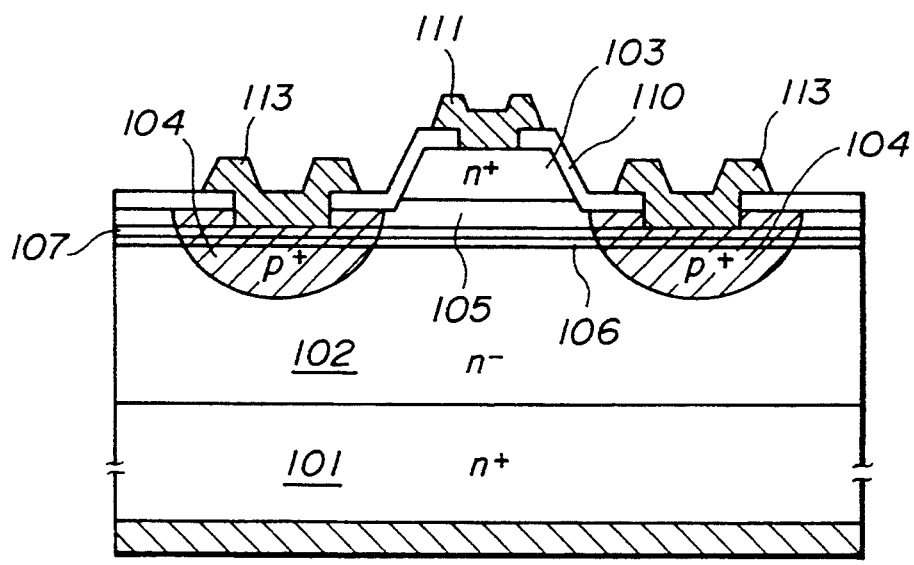
FIG. 4 is a fragmentary cross-sectional view of a static induction semiconductor device comprising GaAs, according to yet another embodiment of the present invention.

FIG. 4 illustrates a static induction semiconductor device comprising GaAs, according to yet another embodiment of the present invention.

The static induction semiconductor device shown in FIG. 4 is a combination of the static induction semiconductor devices shown in FIGS. 2 and 3. Specifically, a p-type channel doped layer 106 is disposed between the n-type high-resistance layer 102 and the hetero layer 105 with an n-type high-resistance layer 107 interposed between the p-type channel doped layer 106 and the hetero layer 105, and the n-type hetero layer 105 is thicker immediately beneath the source region 103 and thinner immediately beneath the surface protective layer 110. The static induction semiconductor device shown in FIG. 4 is thus designed for both increased dielectric strength and increased injection efficiency.

A process of fabricating the static induction semiconductor device comprising GaAs shown in FIG. 1 will be described below with reference to FIGS. 5(A) through 5(C).

Figure 5:
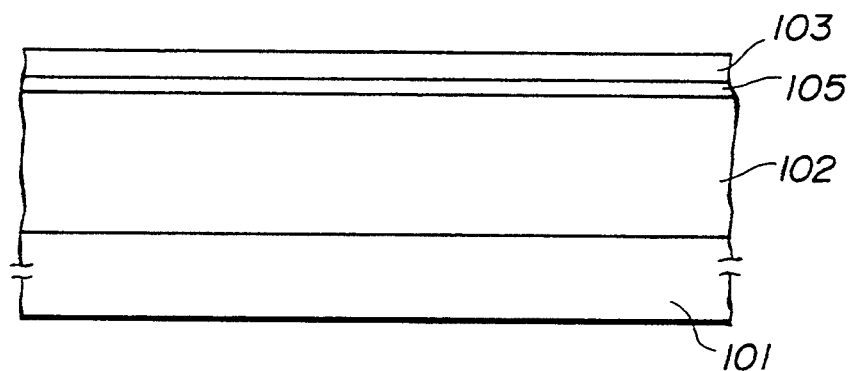
FIG. 5(A) through 5(C) are fragmentary cross-sectional views illustrative of a process of fabricating the static induction semiconductor device comprising GaAs shown in FIG. 1.
Figure 5:
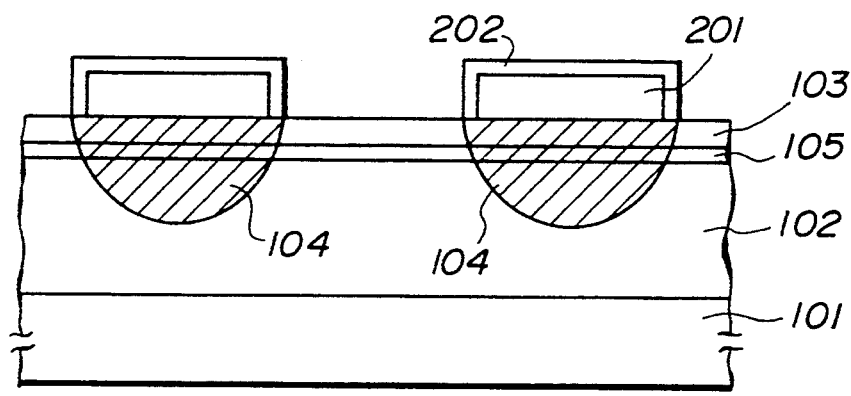
Figure 5:
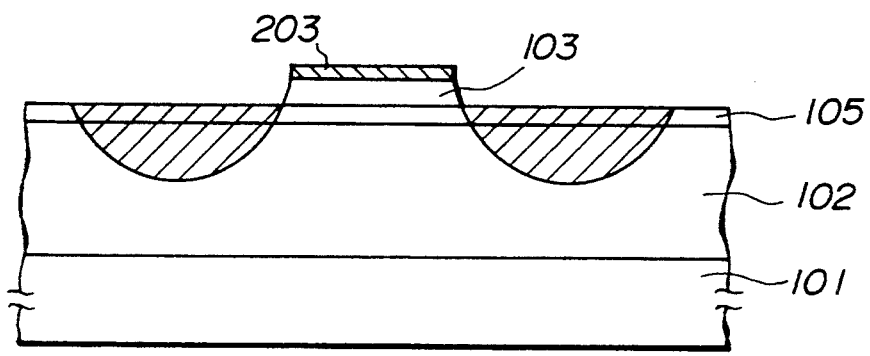
Figure 6:
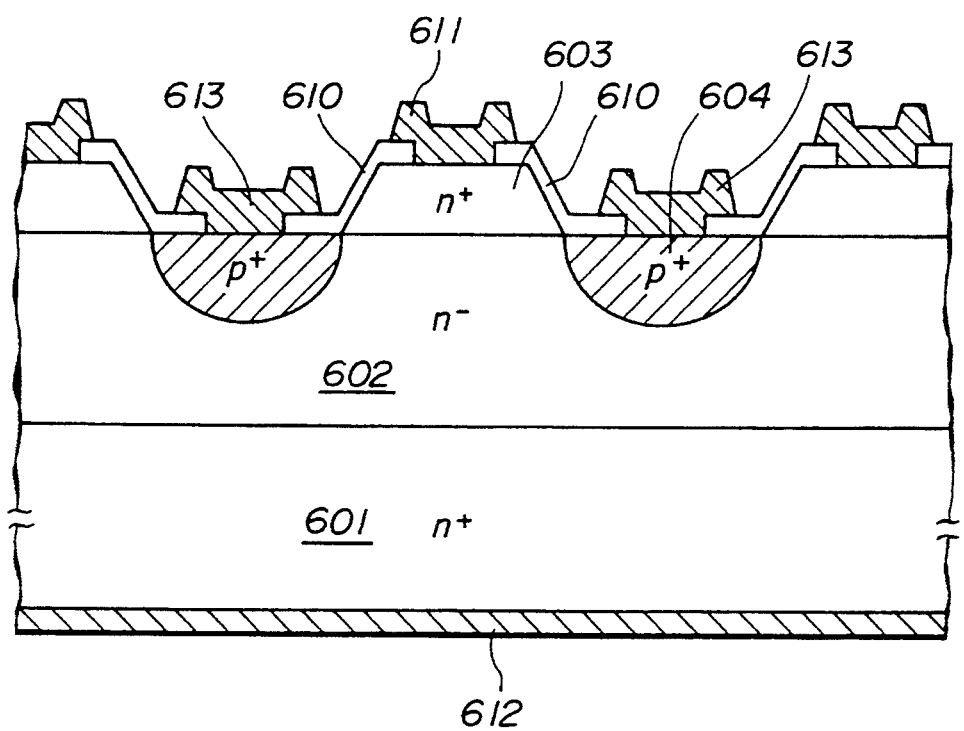
FIG. 6 is a fragmentary cross-sectional view of a conventional static induction semiconductor device made of silicon.

As shown in FIG. 5(A), an n-type high-resistance layer 102 of GaAs, a low-resistance hetero layer 105 of n-type AlGaAs, and a source region 103 comprising an n-type low-resistance layer of GaAs are deposited successively on a drain region 101 comprising an n-type low-resistance layer of GaAs by a suitable deposition technique such as liquid- or vapor-phase epitaxial growth or molecular beam epitaxy, thereby forming a substrate with a laminated structure.

Then, as shown in FIG. 5(B), a diffusion source 201 of ZnO—SiO$_2$ is formed on the substrate by sputtering, and patterned into patterned region. Each of the patterned regions of the diffusion source 201 is covered with a cap layer 202 of SiO$_2$. The assembly is heated in an AsH$_3$ atmosphere within an annealing furnace at a temperature of 650° for 80 minutes. The material of the diffusion source 201 is thereby thermally diffused into the high-resistance layer 102, thereby producing a p-type gate region 104.

Then, the diffusion source 201 and the cap layer 202 are removed, after which a mask 203 is deposited on the surface formed so far by photolithography. The assembly is immersed in an etching solution of H$_2$SO$_4$: H$_2$SO$_4$: H$_2$O$_2$ for mesa etching, forming a source region 103. Thereafter, the mask 203 is removed, and the entire surface is covered with a surface protective layer of SiO$_2$. Then, contact windows are defined in the surface protective layer, and source and gate electrodes each of a laminated structure of AuGe.Ni.Au are formed in the contact windows. A drain electrode of the same laminated structure as the source and gate electrodes is formed on the entire reverse side of the assembly, i.e., in contact with the drain region 101.

While the semiconductor crystal used in the present invention is GaAs, a III–V compound semiconductor material of the than GaAs, such as InP, or Si may be used in the present invention.

In the above embodiments, the hetero layer 105 having a large band gap is disposed in the boundary or interface between the high-resistance layer 102 and the source region 103 also in the boundary or interface between the high-resistance layer 102 and the surface protective layer 110. The minority carrier directed from the gate region 104 toward the source region 103 is blocked by the hetero layer 105, and the number of carriers, i.e., electrons and holes, that recombine through the surface level in the interface between the high-resistance layer 102 and the surface protective layer 110 is reduced, for an increased injection efficiency of the majority carrier. As a consequence, the static induction semiconductor device comprising GaAs can operate well in a bipolar mode with its resistance being sufficiency low when it is turned on.

Although there have been described what are at present considered to be the preferred embodiments of the invention, it will be understood that the invention may be embodied in other specific forms without departing from the essential characteristics thereof. The present embodiments are therefore to be considered in all respects as illustrative, and not restrictive. The scope of the invention is indicated by the appended claims rather than by the foregoing description.

What is claimed is:

1. A static induction semiconductor device comprising:
    a first low-resistance layer of a first semiconductor crystal having a first conductivity type, said first low-resistance layer serving as a drain region;
    a high-resistance layer of the first semiconductor crystal having the first conductivity type, said high-resistance layer being disposed on said first low-resistance layer;
    a second low-resistance layer of the first semiconductor crystal having the first conductivity type, said second low-resistance layer being spaced from said high-resistance layer, said second low-resistance layer serving as a source region;
    a third low-resistance layer of the first semiconductor crystal having a second conductivity type, said third low-resistance layer being disposed in said high-resistance layer in surrounding relationship to said source region and serving as a gate region;
    a protective layer disposed on a surface of said gate region and a surface of said source region; and
    a hetero layer of a second semiconductor crystal having the first conductivity type, said hetero layer being disposed in an interface between said high-resistance layer and said source region and an interface between said gate region and said protective layer, said hetero layer having a band gap larger than said first semiconductor crystal.

2. A static induction semiconductor device according to claim 1, wherein said first semiconductor crystal is GaAs and said second semiconductor crystal is AlGaAs.

3. A static induction semiconductor device according to claim 1, further comprising a channel doped layer of the second conductivity type disposed in an interface between said high-resistance layer and said hetero layer.

4. A static induction semiconductor device according to claim 3, further comprising a high-resistance layer of the first conductivity type disposed in an interface between said channel doped layer and said hetero layer.

5. A static induction semiconductor device according to claim 1, wherein said hetero layer is thicker immediately beneath said source region and thinner immediately beneath said protective layer.

6. A static induction semiconductor device according to claim 1, further comprising
    a channel doped layer of the second conductivity type disposed in an interface between said high-resistance layer and said hetero layer; and
    a high-resistance layer of the first conductivity type disposed in an interface between said channel doped layer and said hereto layer;
    said hetero layer being thicker immediately beneath said source region and thinner immediately beneath said protective year.

7. A static induction semiconductor device as in claim 2, comprising a channel doped layer of said second conductivity type disposed in an interface between said high-resistance layer and said hetero layer.

8. A static induction semiconductor device as in claim 7, comprising a second high-resistance layer of said first conductivity type disposed in an interface between said channel doped layer and said hetero layer.

9. A static induction semiconductor device as in claim 1, wherein said hetero layer comprises a first and a second region comprising Al$_x$Ga$_{x-1}$As, wherein x is a parameter having a value of about 0.3 in said first region, and having a value in a range between about 0 and about 0.3 in said second region.

10. A static induction semiconductor device as in claim 1, wherein said hetero layer comprises $Al_xGa_{x-1}As$, wherein x is a parameter having a value of not greater than about 0.3.

11. A static induction semiconductor device as in claim 1, wherein said hetero layer comprises $Al_xGa_{x-1}As$, wherein x is a parameter whose value depends upon location within said hetero layer.

12. A static induction semiconductor device as in claim 1, wherein said hetero layer comprises $Al_xGa_{x-1}As$, wherein x is a parameter whose value is in a range between about 0 and about 0.3.

* * * * *